United States Patent [19]

Gilissen et al.

[11] 4,203,203

[45] May 20, 1980

[54] ELECTRICAL CONNECTOR AND METHOD OF MANUFACTURE

[75] Inventors: Hermanus P. J. Gilissen, Esch; Petrus R. M. van Dijk; Ludovicus C. van der Sanden, both of 's-Hertogenbosch, all of Netherlands

[73] Assignee: Amp Incorporated, Harrisburg, Pa.

[21] Appl. No.: 944,212

[22] Filed: Sep. 20, 1978

[30] Foreign Application Priority Data

Sep. 24, 1977 [GB] United Kingdom ............ 39854/77

[51] Int. Cl.$^2$ .......................................... H01R 43/00
[52] U.S. Cl. ...................................... 29/846; 29/882; 339/17 F
[58] Field of Search .................. 29/625, 628, 630 R, 29/629; 339/17 F; 179/68.5

[56] References Cited

U.S. PATENT DOCUMENTS

| | | | |
|---|---|---|---|
| 2,945,083 | 7/1960 | Ganske et al. | 174/68.5 |
| 3,069,753 | 12/1962 | Lalmond et al. | 29/628 |
| 3,696,319 | 10/1972 | Olsson | 339/17 F |
| 4,060,889 | 12/1977 | Zielinski | 29/630 R X |
| 4,066,840 | 1/1978 | Allgaier | 29/630 R X |
| 4,111,510 | 9/1978 | Zurcher | 339/17 F |

FOREIGN PATENT DOCUMENTS

700490 12/1953 United Kingdom .

OTHER PUBLICATIONS

IBM Tech. Disclosure Bulletin, vol. 5, No. 11, Apr. 1963, pp. 22-23.

*Primary Examiner*—Francis S. Husar
*Assistant Examiner*—C. J. Arbes
*Attorney, Agent, or Firm*—Allan B. Osborne

[57] ABSTRACT

An electrical connector is formed from a lamina of elastomeric material having conductive tracks on one surface by folding the lamina and bonding opposed lamina portions together. The conductive tracks extend around the fold between contact portions on opposite surfaces of the connector. Suitably the lamina is of thermoplastic material so that bonding is by fusion and the conductive tracks may be flush with the connector surfaces. The connector is formed in a U-shaped nest under pressure and the lamina is formed about a core of elastomeric material.

3 Claims, 9 Drawing Figures

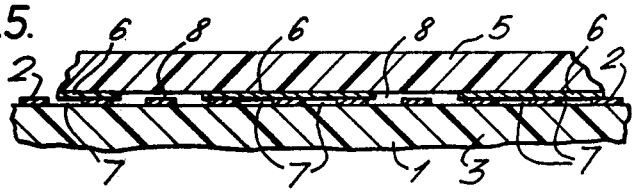
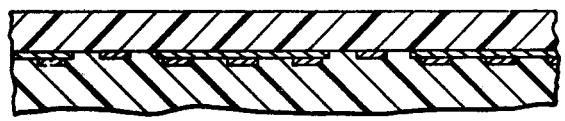
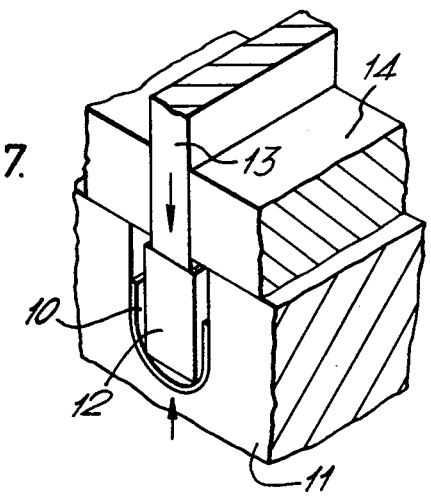
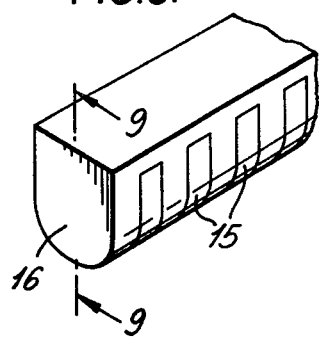
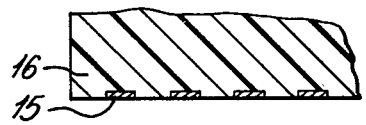

ELECTRICAL CONNECTOR AND METHOD OF MANUFACTURE

This invention relates to electrical connectors of the kind comprising an elastomeric body having spaced contacts at surfaces of the body, the contacts being interconnected in pairs or groups by conductive paths, and to their method of manufacture.

It has been proposed to make such a connector by winding a coil of spaced conductive turns on a cylindrical body of elastomer, bonding the turns in position and then cutting the turns to separate them from each other. It has also been proposed to form annular conductive paths at axially spaced locations around an elastomeric tubular body. It has further been proposed to form the conductive paths on a flexible insulating lamina and to wind the insulating lamina about an elastomeric body.

Generally connectors of the kind specified are required for use in confined spaces, a typical example being in an electronic watch, and as a result they are of small size with closely spaced contacts. Difficulty is experienced in manufacturing such connectors due to the small cross section of the elastomer body required and the fragile nature of the conductive paths, resulting in uneconomic production rates if functional quality of the product is to be ensured.

According to the present invention, a method of forming a connector of the kind specified, comprises forming conductive paths on a lamina of elastomeric material, folding the lamina in generally U-fashion with the conductive paths externally of the fold to present opposed portions of the lamina extending from the fold with the conductive paths extending from the fold along distal surfaces of the opposed lamina portions and around the fold, and bonding the proximal surfaces of the opposed portions together.

The invention includes a connector of the kind specified and which comprises an elongate body of elastomeric insulating material of generally uniform cross section and presenting a pair of generally flat, parallel, opposite surfaces joined at one side by a convexly curved surface, a plurality of spaced conductive paths being on the body, each path comprising a contact portion on each of the opposite surfaces of the body and a portion extending between the contact portions around the convexly curved body surface portion.

Suitably the conductive paths are formed on a lamina of elastomeric insulating material when the lamina is in flat condition by printed circuit techniques, and the lamina is then folded to form the desired product.

As a result the conductive paths project above the surface of the elastomer body according to the thickness of the paths.

In use the connector is suitably sandwiched between a pair of printed circuit boards or substrates which engage the opposed surface portions, contacts on the boards or substrate engaging the one or more contact portions of the conductive paths of the connector. Initially the elastomeric body is compressed elastically by bulk deformation, and relatively high contact forces are generated. This is of advantage in obtaining good electrical contact with low contact resistance between the connector for contacts and the board or substrate contacts. Subsequently the elastomeric material will tend to relax and extrude or creep into spaces defined initially between the generally flat surfaces of the elastomeric body and the adjacent circuit board or substrate surfaces by virtue of the thickness of the conductive paths and the thickness of contacts or conductive paths on the boards or substrates. As a result the spaces progressively become filled with elastomer, and although the contact force may relax, an environmental seal is obtained around the contact interfaces to protect and maintain the initial good electrical contact.

In view of the generally flat surface portions of the elastomeric body the contact portions of the connector intended to engage complementary contacts of a board or substrate, are elongated and thus may present more substantial contact areas to the circuit boards or substrates than would normally be possible with engaging curved surfaces.

In an improved embodiment the conductive tracks are formed flush with the surface of the elastomer body. Suitably the elastomeric insulating material is of a thermoplastic nature such that it will soften and flow at a temperature above that at which the eventual connector is intended to operate and below that temperature at which degradation of the elastomeric and insulating properties take place. A suitable material is a thermoplastic polyurethane rubber.

To manufacture the improved embodiment the conductive paths are formed on a lamina of the elastomeric thermo-plastic material when it is in flat condition by printed circuit techniques and the lamina then folded to the desired configuration in a die nest. The elastomeric material is pressed into the nest and is heated while under pressure to a temperature at which the elastomeric material flows. As a result the elastomeric material fills the spaces between adjacent conductive paths and follows the configuration of the die nest.

The elastomeric material is then cooled to a set condition before it is removed from the nest.

Preferably the lamina of elastomeric material is thin to facilitate bending without imposing excessive tension or other stress on the conductive tracks, and the lamina is formed about a body of similar material to which it is bonded in homogeneous manner. To this end the lamina is placed in a nest of generally U-shape with the conductive paths facing the nest and a block of similar material is urged into the nest against the lamina to urge the lamina into the nest. The lamina and the block of elastomeric material are then heated whilst maintaining the pressure until flow of elastomer takes place. The body and lamina fuse together and the elastomer fills all voids within the nest. The elastomer is then cooled to a set condition before removal of the formed connector from the nest.

The invention will now be described with reference to the accompanying diagrammatic drawings, in which:

FIG. 1 is an enlarged perspective view of an elastomeric insulating lamina formed on its upper face with a plurality of spaced, parallel, rectilinear conductive paths;

FIG. 2 comprises perspective views of successive stages of manufacture from the lamina of FIG. 1;

FIG. 3 comprises transverse cross sections of the connector in the successive stages of manufacture of FIG. 2;

FIG. 5 is a fragmentary sectional view on line A—A of FIG. 4 and illustrating voids;

FIG. 6 is a fragmentary view similar to FIG. 5 after elastomeric material has filled the voids;

FIG. 7 is a fragmentary perspective view of an intermediate stage in the manufacture of a connector of an improved form;

FIG. 8 is a fragmentary perspective view of a connector after completion of the manufacturing step of FIG. 7, and FIG. 9 is a fragmentary longitudinal section taken on line 9–9 of the connector of FIG. 8.

Figure 1:
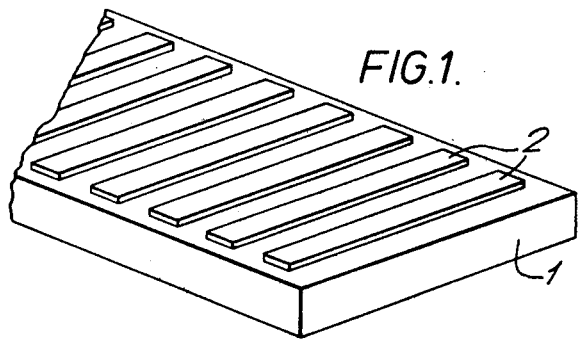

A strip-like lamina 1 of elastomeric insulating material is as shown in FIG. 1, formed with a plurality of spaced parallel conductive paths 2 extending normally transversely of and on one surface of the strip. The conductive paths suitably terminate short of side edges of the strip and, by virtue of their thickness, project above the surface of the strip, and may, for example be of copper, phosphor bronze, beryllium copper, silver, palladium, and may be plated.

Figure 2:
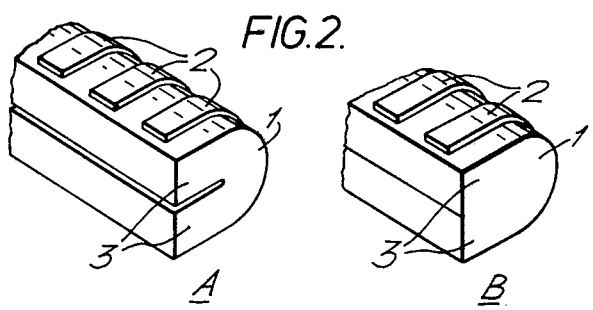
Figure 3:
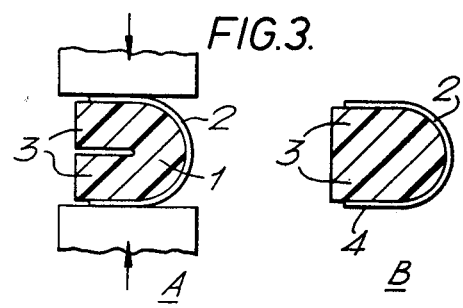

The strip is then folded, as shown in FIG. 2A about a longitudinal median, in generally U-fashion with the conductive paths externally to present opposed lamina portions 3. The lamina portions 3 at their adjacent surfaces are suitably bonded together, as shown in FIG. 2B and this may be effected, as shown in FIG. 3A, by applying pressure to the opposed lamina portions 3 to urge them together. By use of partially cured elastomer or elastomer having thermo-plastic properties and applying heat while in the FIG. 3 condition, the bonding may be achieved. Alternatively, an adhesive bond may be employed.

As seen in FIG. 3B, the conductive paths 2 on distal surfaces of the opposed lamina portions 3 present elongated flat contact portions 4.

Figure 4:
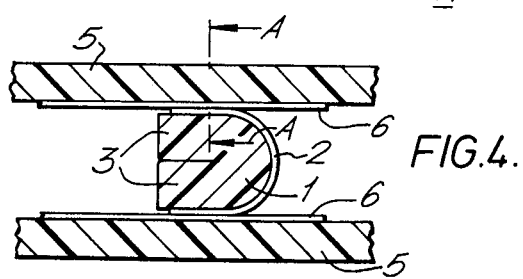
FIG. 4 is a partly sectional, fragmentary view of a connector in use.

In use, as shown in FIG. 4, the connector is sandwiched between printed circuit boards 5 or substrate circuit members, which are formed with circuit paths 6. The circuit paths 6 engage the contact portions 4 of conductive paths 2 to interconnect circuit paths 6 on the upper and lower boards 5, and contact pressure is established by biasing the boards 5 together to compress the elastomer 4 between them.

Initially as shown in FIG. 5 voids 7 remain between the surface of the elastomer lamina portions 3 and the adjacent circuit path faces of the printed circuit board members 5, and voids 8 remain between the surface of the elastomer lamina portions 3 and the surfaces of the boards 5 at regions between circuit paths 6. With passage of time, while the biasing of the boards 5 together is maintained, the elastomeric material creeps between conductive paths 2 to fill the voids 7, and into the voids 8, substantially to seal the contact areas between circuit paths 6 and conductive paths 2.

In the improved embodiment of FIGS. 7 to 9, the connector is formed with conductive paths which are flush with the surface of the elastomer body.

As shown in FIG. 7, during manufacture a lamina flexible printed circuit 10 of strip form is laid lengthwise in the trough of a U-section die nest 11. The strip 10 comprises a lamina of thermo-plastic elastomeric insulating material formed on its face adjacent the nest surface with transverse conductive paths spaced longitudinally of the strip. A strip-like block 12 of the same elastomeric material is laid lengthwise in the nest over the strip 10 and is urged into the nest by a ram 13. The ram 13 is of les width than the nest and is slidable in a guide 14 which overlaps sides of the nest.

The elastomeric material within the nest is suitably heated to a temperature at which if flows under pressure between the rams 13 and the nest 11 as indicated by arrows to fill voids within the nest and is then cooled to a set condition.

The moulded connector may then be removed from the nest 11 and is of the form shown in FIG. 8. As shown in FIG. 9 the conductive paths 15 are embedded in the elastomeric body 16 with outer surfaces of the paths 15 and the body 16 being flush.

In a particular connector manufactured according to the method illustrated in FIG. 7, a lamina of 5 mm width and 0.1 mm thickness was used, the conductive tracks extending across the width of 5 mm, and each having a width of 0.1 mm with a spacing of 0.2 mm between tracks. The resultant connector, according to FIG. 8 had a cross-sectional width and height of 2 mm, and was of length 20 mm. The elastomer used was a thermo-plastic polyurethane rubber. The following materials have been found suitable:

HI-TUFF from Stevens Corporation, Easthampton, Mass. U.S.A.

TEXIN from Mobay Corporation, Pittsburgh, U.S.A.

PLATILON from Plate Company of Bonn, W. Germany.

The materials have been formed in the nest at temperatures between 150 and 200 degrees C. and the resulting connectors have been found suited to operational use within the range −40 to +80 degrees C.

In order to provide connectors with a higher operating range, partially cured elastomeric materials such as silicon rubbers may be used. In this case a preformed core portion 12, configured to match the nest is employed since the material is not mouldable in the manner of a thermo-plastic material, and further, once the lamina and core have been cured they will form a unitary elastomer body in a final form which is permanent.

We claim:

1. A method of forming a connector for use between printed circuit boards or the like and having spaced contact portions at opposed surfaces of an elastomeric body, the contact portions on the opposed surfaces being interconnected by conductive paths, the method comprising the steps of;
   a. forming conductive paths on one surface on a lamina of elastomeric material;
   b. folding the lamina in generally U-shaped fashion to bring the other surface of the lamina into abutting engagement and with the conductive paths extending along the distal surfaces and around the fold, the portion of the paths between the fold and ends of the lamina providing flat portions adapted to be contacted by the printed circuit boards or the like; and
   c. bonding the abutting surfaces together.

2. A method of forming a connector comprising the steps of:
   a. providing a flexible strip of thermoplastic elastomeric material with a plurality of conductive circuits printed thereon;
   b. placing the flexible strip in U-shaped nest with the printed circuits facing the nest surface;
   c. urging a body of elastomeric material into the nest against the flexible strip;
   d. forming the connector by heating the strip and body under the urging pressure until fusion of the strip and body occurs;
   e. cooling the connector to a set condition while still under pressure; and
   f. removing the connector from the nest.

3. A method as claimed in claim 2 characterised in that the body of elastomeric material is urged into the mould nest by a ram of less width than that of the U-shaped nest of the ram being slidable in a guide overlapping sides of the nest.

* * * * *